US007102392B2

(12) United States Patent
Hsu et al.

(10) Patent No.: US 7,102,392 B2
(45) Date of Patent: Sep. 5, 2006

(54) SIGNAL DETECTOR FOR HIGH-SPEED SERDES

(75) Inventors: Louis L. Hsu, Fishkill, NY (US); Karl D. Selander, Hopewell Junction, NY (US); Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 10/905,704

(22) Filed: Jan. 18, 2005

(65) Prior Publication Data

US 2006/0158229 A1 Jul. 20, 2006

(51) Int. Cl.
*H03K 5/19* (2006.01)
(52) U.S. Cl. .......................................... 327/20; 327/65
(58) Field of Classification Search .................. None
See application file for complete search history.

(56) References Cited

U.S. PATENT DOCUMENTS

| 4,868,470 | A | | 9/1989 | Bucska et al. .............. 318/561 |
| 6,246,268 | B1 | | 6/2001 | Cheng .......................... 327/65 |
| 6,377,082 | B1 | | 4/2002 | Loinaz et al. ................. 327/20 |
| 6,831,521 | B1 | * | 12/2004 | Abidin et al. ............... 330/308 |
| 2003/0164724 | A1 | * | 9/2003 | Momtaz et al. ............. 327/165 |

OTHER PUBLICATIONS

Pending IBM application entitled "Reducing Power Consumption in Signal Detection", U.S. Appl. No. : 10/873,672, Filing date: Jun. 22, 2004.

* cited by examiner

*Primary Examiner*—Timothy P. Callahan
*Assistant Examiner*—Cassandra Cox
(74) *Attorney, Agent, or Firm*—Steven Capella

(57) ABSTRACT

An improved signal detector system implementable in a high-speed SerDes receiver core that is able to detect valid signals from noise signals with a much tighter tolerance. The signal detector system improves upon the prior art designs by implementing modifications including: (1) the use of two peaking amplifiers for both (differential) input signals and reference to track and cancel gain variation; and, (2) the reduction of current mirroring stages to cut down current mapping error.

35 Claims, 6 Drawing Sheets

US 7,102,392 B2

SIGNAL DETECTOR FOR HIGH-SPEED SERDES

CROSS REFERENCE TO RELATED APPLICATIONS

The present invention is related to commonly-owned, co-pending U.S. patent application Ser. No. 10/604,799 entitled APPARATUS AND METHOD FOR DETECTING LOSS OF A HIGH-SPEED SIGNAL, the whole contents and disclosure of which is incorporated by reference as if fully set forth herein.

BACKGROUND OF THE INVENTION

Field of the Invention

The present invention related generally to programmable CMOS signal detecting circuits for detecting both presence and absence of incoming signals in duplex SerDes (Serializer-Deserializer) communication links, and more particularly, to a novel high-speed signal detector having a capability to differentiate signal from noise with a tighter margin for a duplex SerDes.

A duplex SerDes (Serializer-Deserializer) link comprises at least a receiver and transmitter pair in the same core. The receiver complex is designed to receive serialized signals transmitting from a remote transmitter, and converts (or deserialize) the data into parallel format before receiving them to the core for further processing. On the other hand, the transmitter takes parallel data internally from the core, and serializes them by a data serializer. The serialized data stream is sent to a remote receiver. When data are first received from the outside world prior to further processing, the data must be first verified for its validity. Once the valid data are identified, they are used to set up the clock rate via clock recovery hardware. Thus, the generated clock will be self-synchronized with the incoming data. After clock recovery, valid data are successfully sampled by the clock and latched into the receiver unit.

It is desirable, however, that the SerDes has a signal detecting device to distinguish "good" data from "bad" data. For example, when the cable is unintentionally disconnected (so called "loss-of-line"), damaged or temporarily interrupted, the data transmitting during this period becomes totally invalid or not reliable. At this moment, the invalid data could be random noise or stuck-on-high or low or, its amplitude is significantly reduced. Furthermore, an intelligent receiver design equipped with DFE (decision feedback equalizer) tries to bring the signal amplitude up even when the signals are attenuated by the media or by cross talk. Therefore, it is important for a receiver system to determine when the signals are ruined, so that it can make decisions to scrap the packet of the data and request for data resubmission. Thus, it is critically important that the signal detector can detect signal when the incoming signals reach above a specific "good-signal" level, and detect no-signal when they reach below a specific "bad-signal" level.

It is a great challenge to design an acceptable signal detector wherein the "good-signal" level and "bad-signal" level are fairly close to each other at all operating conditions. Earlier designs achieve Fibre-Channel specifications with signal and noise levels of 400 mVppd and 135 mVpdd, respectively. However, it can not meet other tighter specification, such as the Inifini-Band specification with signal and noise of 185 mVddp to 85 mVppd, respectively.

The patent literature is replete with systems and circuits for detecting signal loss, a few representative examples of which are now described as follows:

U.S. Pat. No. 6,377,082, entitled "Loss-of-Signal Detector for Clock Data Recovery Circuit", describes a loss-of-signal (LOS) detector circuit comprising (1) a transition detector for detecting stuck-on-one and stuck-on-zero LOS condition, and (2) an inconsistency detector for detecting random and undersized signals. There is a fundamental problem with this design, in that the signals must be healthy at the beginning of data communication period in order to recover the clock. The clock is then used to sample the subsequent data stream using two decision circuits to decide whether the data is valid or not. If the data is bad at the very beginning, the recovered clock may not be accurate to sample the incoming data, then this LOS detect scheme would not work at all. Another problem with this approach is it has only one threshold level set to detect the loss of signal. For a flexible SerDes design, it is important that one receiver system design can satisfy for multiple applications having different signal and operating voltage specifications. A good signal threshold for one system, could be noise for others. This prior art failed to address how to make a programmable signal detector which can be used for detecting a wide range of signals.

U.S. Pat. No. 4,868,470, entitled "Apparatus and Method for Detecting a True Average of N Signal Samples", describes a method and apparatus for detecting a true average value of n signal samples to be used in a tracking servo control system for a hard disk drive. In a tracking servo system for a hard disk drive device, a pattern is recorded in a servo area on the disk which, when reproduced, produces a series of pulses in a repeating pattern which indicates the position of the servo head. It teaches a technique on how to detect a true average level of number of servo pulse samples. It is highly desirable to make an accurate measurement of averaged pulse height within a short period of time to avoid error in the servo control operation.

U.S. Pat. No. 6,246,268, entitled, "CMOS Integrated Signal Detection Circuit with High Efficiency and Performance", describes a CMOS signal detection circuit that comprises: (1) a low-pass filter, (2) a high-pass filter, (3) built-in off-set generator and a (4) comparator is designed to detect signals within certain frequency ranges and strengthen them for communication systems. The advantage of this signal detector is its simplicity as it comprises a signal sensor unit formed by these elements and, further that is designed to receive differential input signals.

A further detector 100 implementable in a high-speed SerDes core as described in commonly-owned, co-pending U.S. patent application Ser. No. 10/604,799 entitled APPARATUS AND METHOD FOR DETECTING LOSS OF HIGH-SPEED SIGNAL is now described and shown in FIG. 1 as comprising four elements; (1) Front Stage Receiver 101 used to buffer/amplify the input differential signals DN and DP input thereto and to adjust the common mode level thereof to a desirable level and output a respective pair of differential voltages DAN and DAP having a lower common mode level; (2) Level Generator 102 that is programmable for generating and adjusting the threshold level, e.g., $V_{LEVEL}$, that is eventually referenced to the signal level such that when the incoming signal has a lower level, the threshold level is set lower, and when the incoming signal has a higher level, the threshold level is set higher; (3) Level Detector 103 that generates time-averaged signal INN and a reference level signal INP, using amplified signal pair DAN/DAP and the detected common mode level $V_{COM}$ and the adjusted threshold level $V_{LEVEL}$ output from the level generator 102; and, (4) a Comparator 104 for comparing a signal level INN detected by the level detector 103 to a reference level INP generated thereby to determine whether a valid signal is present or absent on the incoming signal lines DN and DP. This signal detector 100 is adapted to receive incoming differential signals with a high common mode voltage. For example, in DC coupling mode, the common mode voltage of the incoming signals is at "Vdd-½* signal swing". In AC coupling mode, the common mode is set always at a fraction of supply level, for example "0.8*Vdd". In order for signal detector to function at high common mode level, a common mode shifting block is necessary. Thus, the signal detector system 100 of FIG. 1 includes operating steps of: (1) shifting the common mode of the incoming signals to a desirable level and amplify them if it is necessary; (2) creating a proper threshold level based on the common mode level; (3) creating a sensed signal level from the incoming signal, and creating a reference level which is referenced to the common mode of the incoming signal pair and (4) comparing the sensed signal level and reference level within a certain sampling period, if the sensed signal level exceeds the reference level, then good signal is detected, or otherwise, the signals are bad, or line is lost.

One drawback of the signal detector system 100 of FIG. 1 is the implementation of the front stage peaking receiver 101. The gain variation due to this peaking receiver jeopardizes the tolerance control on the detecting signal range. Since the gain applies only to the sensed signal but not on the reference, as the result, the signal detecting range, e.g. between on-signal and off-signal is wide, and may not meet some customer specifications. For example, in order to meet the InfiniBand™ Architecture specification (e.g., InfiniBand™ Architecture Release 1.2 High Speed Electrical Signalling—2.5, 5.0, & 10.0 Gb/s Jul. 29, 2004), the signal detector must detect signals with 185 mV Vppd (Vppd stands for peak-to-peak differential), and undetect signals with 87.5 mV Vppd. This design however can meet a looser specification such as Fibre-Channel with signal ranges from about 400 mV to 135 mV Vppd.

Further, the system 100 depicted in FIG. 1 may fail to achieve the tightened specifications due to the current mirroring scheme, illustrated in FIG. 2, which depicts the level generator circuit 102 of the signal detector of FIG. 1. Particularly, as shown in FIG. 2, the Level-Gen block 300 functions as a common mode voltage level generator including a common mode setting device 330 embodied as a resistive voltage divider having two identical value resistors $R_1$, $R_2$ each placed between different ones of the incoming differential signals DAN and DAP. The center node of this voltage divider is connected to the positive input of the differential peaking amplifier 340 at the gate of N16, the center node having a voltage that is equal to the instantaneous average of the two signals DAN and DAP, i.e. the common mode voltage level of DAN and DAP. A feedback loop is formed from the output of the differential peaking amplifier 340, a p-type insulated gate field effect transistor (pFET) P3 at the output and a load resistor back to a negative input of the differential peaking amplifier 340 at the gate of N17 functions to produce an output common mode voltage level $V_{COM}$ substantially equal to the common mode voltage at the input to the differential peaking amplifier 340. The voltage threshold level $V_{LEVEL}$ is generated in reference to the detected common mode level $V_{COM}$. The threshold voltage level $V_{LEVEL}$ is determined by the voltage of $V_{COM}$ plus the voltage difference across resistor $R_4$ as a result of the biasing mirrored tail current through N13, N14 and N15. The threshold level is normally set to the middle of the sensed signal range. For example, the threshold level to meet the Fibre-channel spec is targeted at about 135 mV while for the Infiniband is at about 65 mV. In such way, the threshold level $V_{LEVEL}$ remains pegged to the common mode level $V_{COM}$, such that when a good signal is presented to the signal detector 100, it increases when $V_{COM}$ increases by the same amount that $V_{COM}$ increases, and decreases when $V_{COM}$ decreases by the same amount. The actual amount of the voltage difference between $V_{LEVEL}$ and $V_{COM}$ is determined both by the magnitude of current through N15 and the resistance of $R_4$. Thus, by varying the current and/or the resistance $R_4$, the voltage difference between $V_{LEVEL}$ and $V_{COM}$ can be tuned to a desirable level.

However, as shown in FIG. 2, a programmed reference current Iref that is created by the current-based digital/analog converter (IDAC) 310 is mirrored first via pMOS devices P1 to P2 of current mirror stage 320, and then mirrored via nMOS devices N13 to N14 and N15. It is understood that the DIG<n> receives programmed bits, e.g., n-bit vectors, to tune the IDAC to draw the desired reference current, i.e., adjust the levels of an incoming current reference Iref. Implementing the extra current mirroring stages (nMOS and pMOS devices) enlarges current tolerance and causes significant level variation. Additionally, as the design has to cover a wide signal range, the reference current and thus the mirrored tail currents flowing thorough tail devices N13, N14, and N15 vary widely. By increasing the tail current without changing the load device P3 size, it causes more fluctuations on the generated threshold level, thus decreasing accuracy.

In view of the foregoing, there is a need in the art to provide a programmable CMOS signal detecting circuit for detecting both presence and absence of incoming signal, and more specifically, a detecting circuit that not only can perform signal detection, but includes a capability to differentiate signal from noise with a tighter margin.

SUMMARY OF THE INVENTION

This invention relates to an improved signal detector system implementable in a high-speed SerDes receiver core that is able to detect valid signals from noise signals with a much tighter tolerance. The signal detector system improves upon the prior art designs by implementing modifications including: (1) the use of two peaking amplifiers for both (differential) input signals and reference to track and cancel gain variation; and, (2) the reduction of current mirroring stages to cut down current mapping error. Thus, the improved signal detector system of the invention responds to the incoming differential signals with specific "on-signal" and "off-signal" level ranges more accurately.

More specifically, the improved signal detector system of the invention responds to the incoming signals with a specific "on-signal" and "off-signal" level ranges more accurately. For example, if an incoming signal has a peak-to-peak differential of 400 mV is considered as a valid signal, while 200 mV is considered not a valid signal. The signal detector is able to produce a logic "high" representing good signal whenever incoming signal level is greater than 400 mV. On the other hand, whenever the incoming signal level is less than 200 mV, the signal detector produces a logic "low" to indicate that there is no valid signal. To meet the tight Infiniband spec, any signal level falls in between 175 mV and 85 mV would be considered as gray area which means neither a valid, nor an invalid signal. Therefore, the goal of signal detector design is to make the gray zone as small as possible. In other words, a successful signal detector design to meet Infiniband spec is the design that has a grey zone that is smaller than 175 mV and 85 mV.

The signal detector circuit of the invention is designed so that such an undetermined gray area is reduced to as tight a margin as possible. It is also desirable that signal detect circuit is able to detect signal with a wide frequency range. Due to ISI (or inter-symbol-interference) effect, more attenuation occurs with high frequency signals. Therefore the worst case is to design a signal detector which can detect signals having the specified maximum frequency, and detect no-signal with minimum frequency.

According to the invention, there is provided an improved signal detector system and method comprising: a means for receiving a differential pair of input signals; a means for generating a common mode (CM) level of the input signals; a means for generating a predetermined threshold level referenced to a detected CM level; a means for generating a sensed signal level from the differential pair of input signals; a means for generating a reference level referenced to the threshold level; a means for eliminating gain variation between the sensed signal level as a result of receiving the differential pair of input signals, and the generated reference level; and, a means for comparing the sensed signal level and the reference level to detect whether a valid input signal is being received, wherein the detector enables determination of a valid input signal within a predetermined signal margin.

Besides the ability for detecting valid signals from noise signals with a much tighter tolerance, the improved signal detector system of the invention is able to detect signals with a wide frequency range at wide temperature and power supply ranges. Further, it is advantageously programmable to satisfy different signal detecting specifications. These include systems with a wide range of operating voltages, signal frequencies and amplitudes. Thus, it can be used in communication apparatus that set up either in AC or DC coupling mode with different common mode levels.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE PREFERRED EMBODIMENTS

Figure 1:
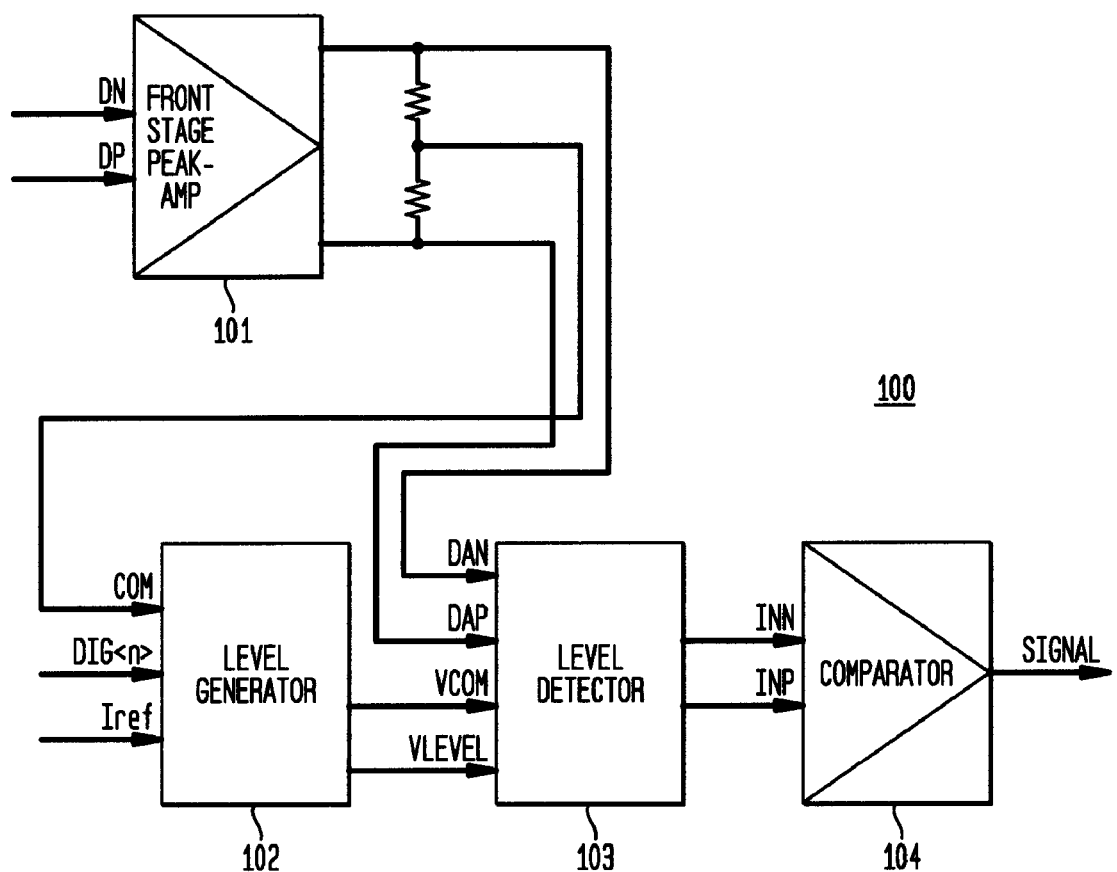
FIG. 1 is a block and schematic diagram illustrating interconnection and use of a signal detector 100 for a SerDes core according to the prior art.
Figure 3:
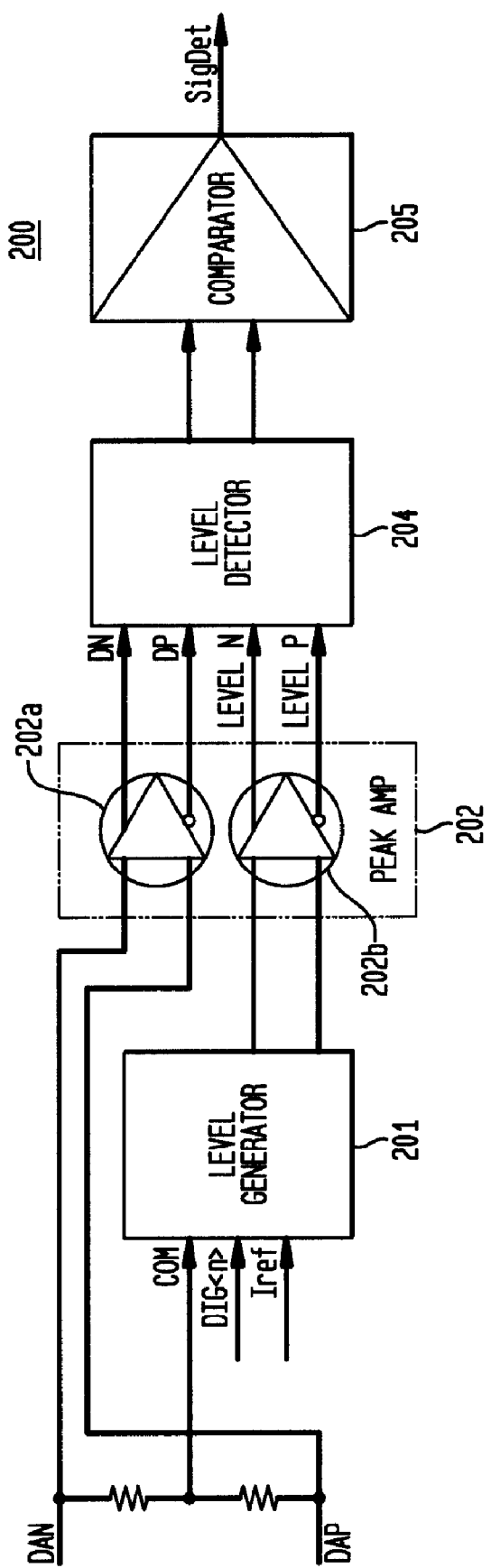
FIG. 3 illustrates the improved signal detector system 200 of the present invention.

With reference to the accompanying drawings, FIG. 3 illustrates the improved signal detector system 200 of the invention which adapts the design of the prior disclosed signal detector circuit 100 of FIG. 1, however, implements two modifications: (1) the use of two peaking amplifiers 202 for both input signals, and a reference circuit to track and cancel gain variation; and, (2) the elimination of current mirroring stages in the level generator 201 to cut down current mapping error. Details of each aspect of the invention will be described in greater detail hereinbelow.

The signal detector circuit of the invention as shown in FIG. 3, as modified, is designed to detect signals within as tight a margin as possible, and, within a wide frequency range. Due to ISI (or inter-symbol-interference) effect, more attenuation occurs with high frequency signals. Therefore, the worst case is to design a signal detector which can detect signals having the specified maximum frequency, and detect no-signal with minimum frequency.

As shown in FIG. 3, according to a first improvement of the invention, in order to extend the bandwidth of the signal detector but simultaneously to cancel the gain variation caused by the peaking receiver, a pair of peaking receivers 202 is implemented in the signal detector topology 200. Here, gain variation means signal gain as a function of process, temperature, signal frequency and voltage supply level. The first peaking amplifier 202a is used to extend the bandwidth of the signals, while the second and identical peaking amplifier 202b is used to cancel the gain variation. In other words, gain variation that is introduced by the peaking amplifier to the differential input signals DN, DP is also tracked and applied to the level generator. In one aspect of the invention depicted in FIG. 3, the second peaking amplifier 202b is connected between the level generator 201 and level detector 204 for receiving and amplifying dual reference level signals Level_P, Level_N (referenced to tracked $V_{COM}$) generated by the level generator 201, as will be explained in greater detail herein. It is critical that both peaking amplifiers 202a,b have substantially identical size and physical design. It is further desirable that they are placed side-by-side in the close vicinity area to avoid variation caused by the environment. As a result, whatever the gain variation experienced by the received input signals DN, DP is also experienced by the resulting dual reference level signals Level_P, Level_N, so that the gain variation effect is completely cancelled which is found to improve signal tolerance significantly.

Figure 4A:
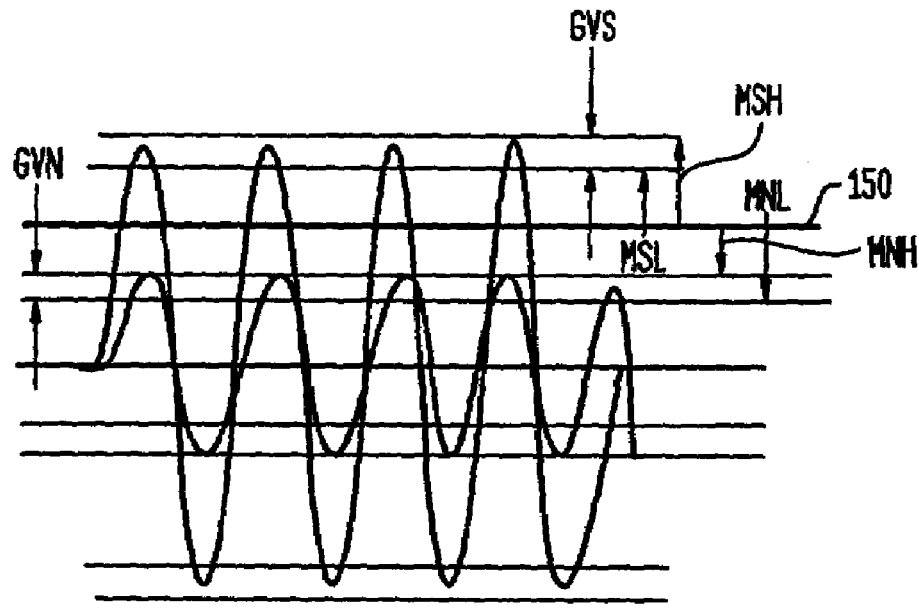
FIGS. 4(a) and 4(b) depict example waveform diagrams of the impact of gain variations for the prior art signal detector system (FIG. 4(a)) and the gain variations for the signal detector system of the present invention (FIG. 4(b))
Figure 4B:
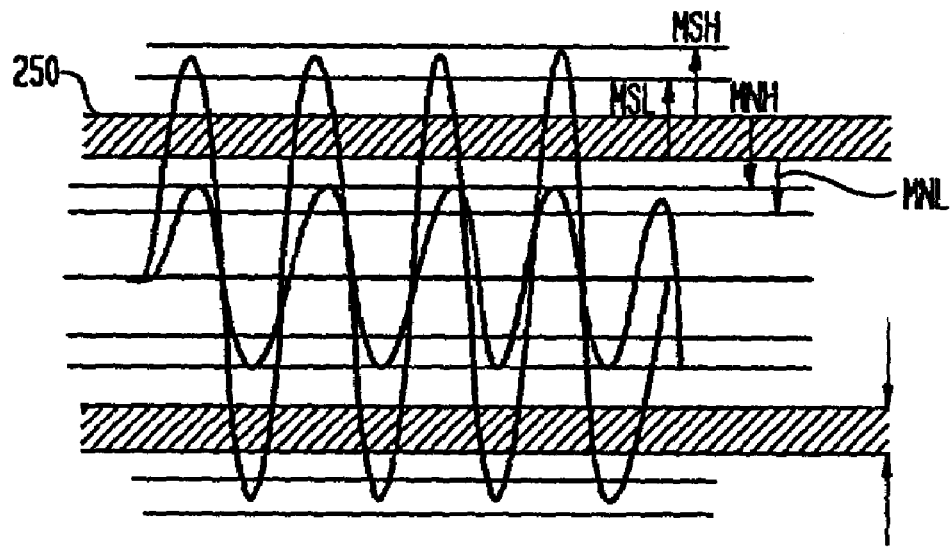

FIGS. 4(a) and 4(b) depict example waveform diagrams of the impact of gain variations for the prior art signal detector system and the signal detector system of the present invention, respectively. In the prior art signal detector system (FIG. 1), the post peaking amplifier gain variation on the signals, GVS, as well as the post peaking amplifier gain variation on the noise, GVN, have no effect on the generated level 150, since when temperature rises, both signal and noise level drop due to gain reduction of the peaking amplifier. But, such reduction does not reflect on the reference level 150. As the result, the margin of reference to signal will be reduced, while the margin of reference to noise is increased. This means signal detector will experience more fail on detecting valid signal but less failure on detecting invalid signals. Referring to FIG. 4(b), according to the invention, the gain variation of signals and noise levels are tracked to each other. This means the level 250 to signal (or noise) margin (MSH, MSN, MNL and MNH) is ideally maintained constant—independent of the gain variation.

As further depicted in FIG. 3, the level generator 201 provides dual threshold levels including the first level Level_P which is the threshold level higher than the detected common mode level $V_{COM}$ and referenced thereto, a second voltage threshold level Level_N which is the threshold level lower than the detected common mode level $V_{COM}$. The voltage level of Level_P is determined by the voltage of $V_{COM}$ plus the voltage difference across a first resistor $R_4$ as a result of the biasing mirrored tail current, and the voltage level of Level_N is determined by the voltage of $V_{COM}$ less the voltage difference across a second resistor $R_5$ as a result of the biasing mirrored tail current. In such way, both threshold levels Level_P and Level_N remains pegged to the common mode level $V_{COM}$, such that when a good signal is presented to the signal detector 200, they increase by the same amount that $V_{COM}$ increases, and decrease by the same amount when $V_{COM}$ goes down. It is understood that the actual amount of the voltage difference between Level_P/Level_N and $V_{COM}$ is determined both by the magnitude of mirrored tail current and the resistances of $R_4/R_5$ respectively. Thus, by varying the mirrored tail current and/or the resistance values $R_4/R_5$, the dual reference voltage levels pegged to $V_{COM}$ can be tuned to a desirable level. Thus, returning to FIG. 4(b), in the signal detector circuit 200, not only are differential reference levels Level_P and Level_N created, but also the gain variation of signals and levels are tracked to each other. This means the level 250 to signal (or noise) margin (MSH, MSN, MNL and MNH) is ideally maintained constant—independent of the gain variation. The sensing margin is thus improved. Again, the peaking amplifier implemented in the invention, is not used to peak the gain at any specific frequency but to extend the bandwidth, so that the signal detector can be used for a wide incoming data rate range.

Figure 2:
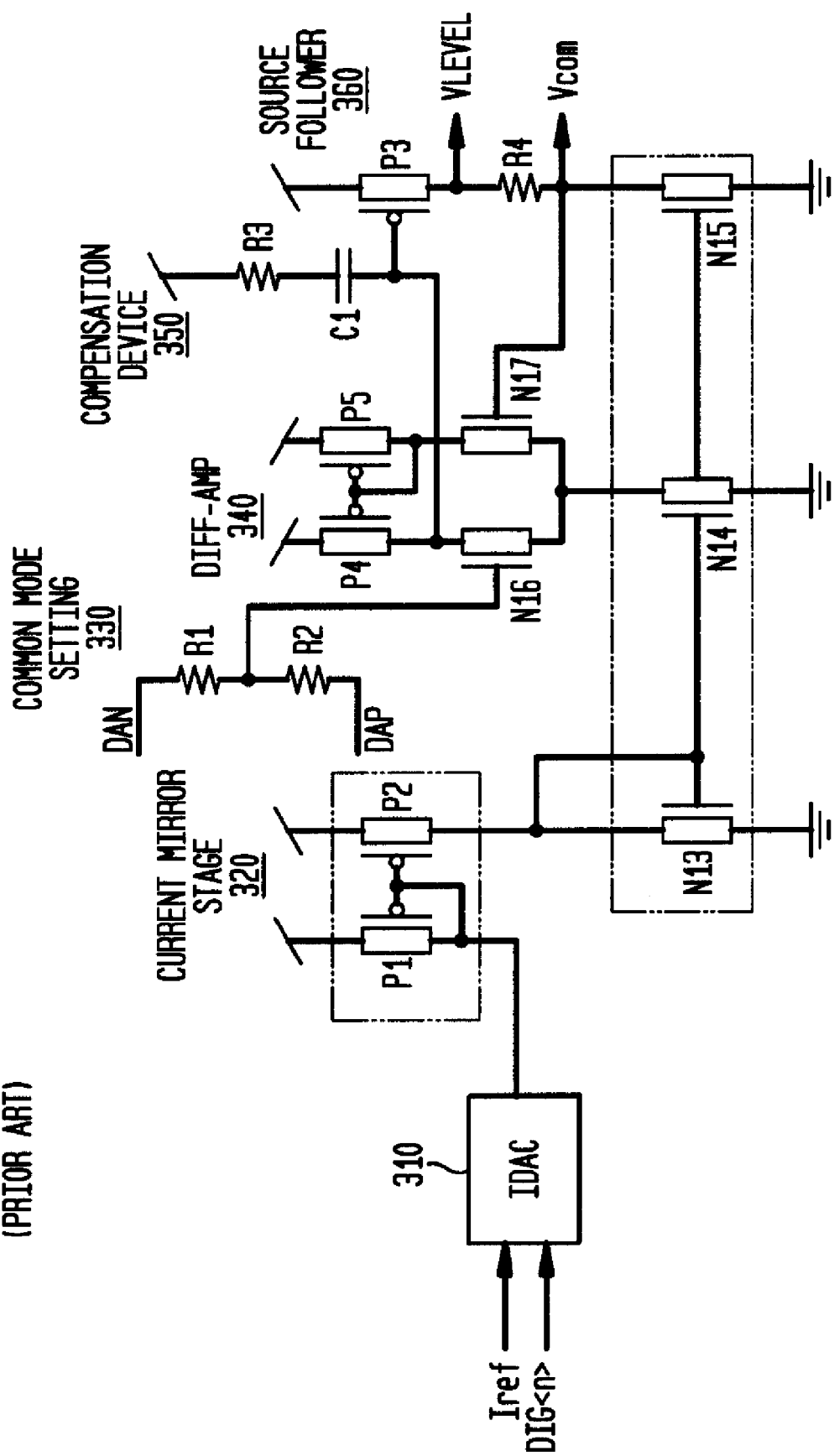
FIG. 2 depicts a circuit schematic of the level detector block of the signal detector system 100 of FIG. 1.
Figure 5:
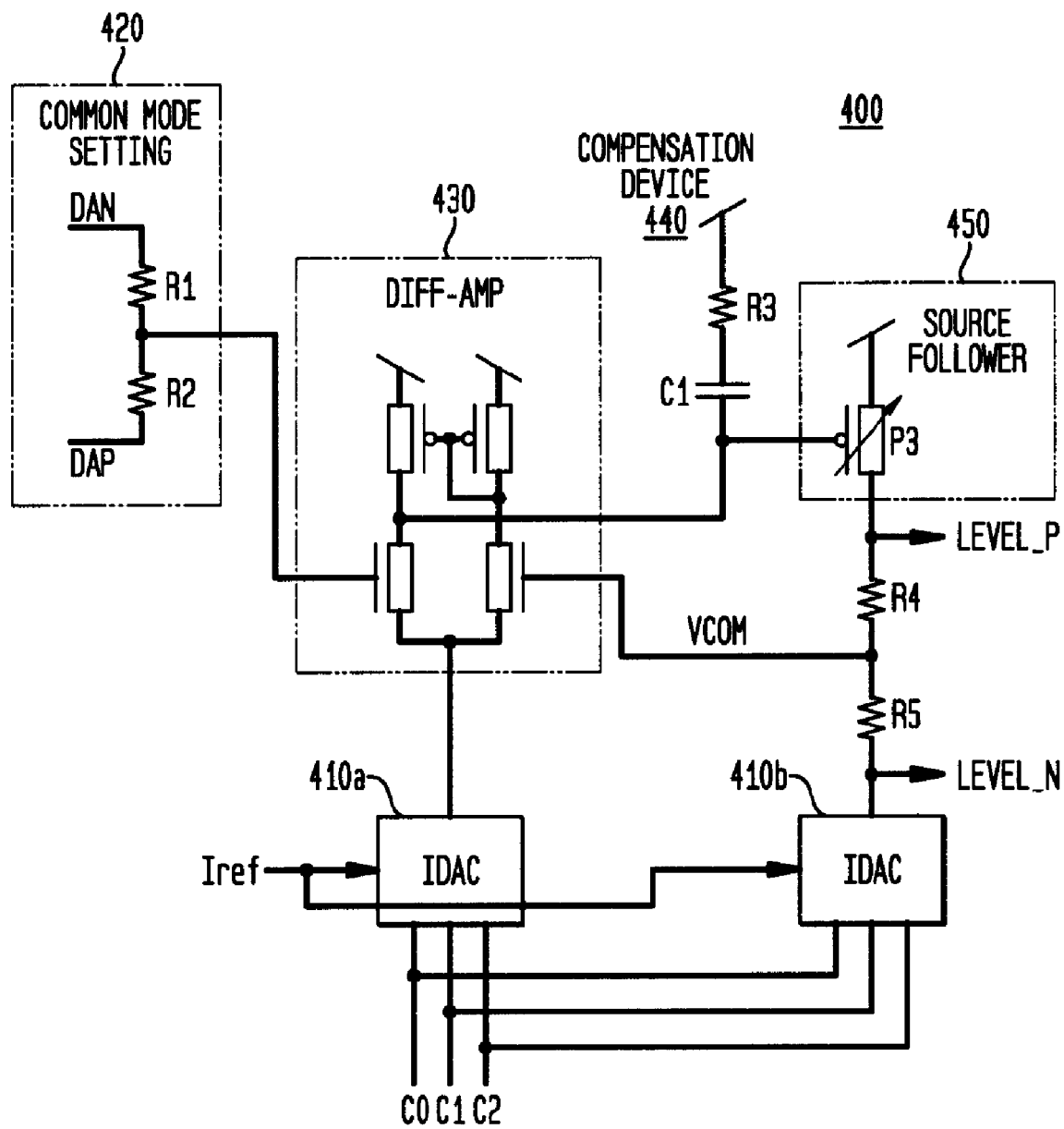
FIG. 5 depicts the improved level generator circuit 400 corresponding to the level generator 201 of FIG. 3; and, FIG. 6 depicts a simplified block diagram of a high-speed HSS receiver core implementing the improved signal detector system of the present invention.

According to the second improvement of the invention, the signal detector circuit 200 of FIG. 3 is designed to eliminate use of the current mirroring stages in the level generator 201. FIG. 5 depicts the improved level generator 400 corresponding to the level generator 201 of FIG. 3. As shown in FIG. 5, the level generator circuit 400 comprises two identical IDACs (current-based digital-to-analog converters) 410a, 410b utilized to directly provide programmable tail current for level generator 201. The first IDAC 410a is used to generate tail current for the differential-peaking amplifier 430 and replaces the pMOS devices P1 to P2 of prior art current mirror stage 320 (FIG. 2), and the other IDAC 410b is used to generate tail current for the output gain stage, or a source follower 450 and replaces the nMOS devices N13 to N14 and N15 of prior art tail current mirror stage. The resulting circuit size is not much bigger than the prior art designs where only one IDAC is needed because the extra IDAC is about the same size as that of the eliminated current mirror stages. By eliminating one stage of current mirroring, the fluctuation of the generated reference level has a much tighter tolerance, and results in tightening the signal detecting window. That is, by eliminating the two mirroring stages of the prior art design, it mitigates the tolerance of the reference levels LEVEL_P and LEVEL_N with a large tolerance thus, tightening the detectable signal margin.

By implementing these improvements, the newer version of the signal detector circuit outperforms its previous version. The level detector circuit 204 and comparator circuit 205 depicted in FIG. 3 thus, may comprise the respective level detector and comparator circuit as described in commonly-owned, co-pending U.S. patent application Ser. No. 10/604,799, incorporated by reference herein.

For example, a signal range that can be successfully and repeatedly detected (peak-to-peak signal height) is 87.5 mv to 43.5 mV which is adapted to meet the InfiniBand™ Architecture specification within a tighter margin. It can be operated at a wide range of incoming data rate, e.g. from 1.25 Gbs to 6.4 Gbs. Moreover, the advantage of this design, by adjusting the threshold level, the signal detector can be used to detect signal with different frequency, or different data patterns, for example, alternating one zero pattern, five ones and five zeros, or random patterns. By adjusting the threshold level, the signal detector can also be used to detect signal for different receiver systems with different power supply level and different system specs. For instance, the signal detector is capable of operating in receivers having voltage supply levels ranging between 1.0 V to 1.95V. Furthermore, the signal detector is capable of detecting data in input signals at frequencies ranging between 100 MHz and 6 GHz. The signal detector further is adapted to detect the presence and absence of the signals within a preset sampling time, e.g. 50 ns, so the system can respond rapidly to a loss-of-signal condition. It is guaranteed to function under a temperature range, e.g. −40 C. to 125 C., and within a controlled process variation.

Figure 6:
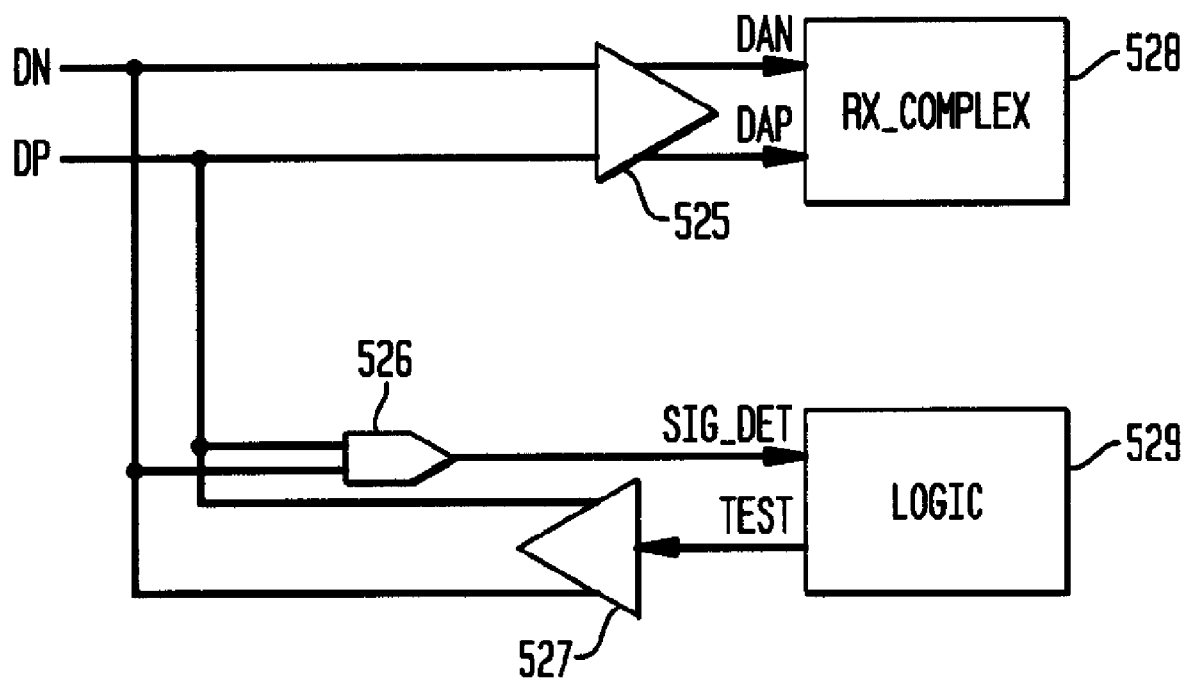

The CMOS signal detector design of the present invention may be implemented in a high-speed HSS receiver core such as IBM's 6.4 G HSS receiver core depicted generally in FIG. 6. In this core, an incoming differential signal pair, DN, DP is received by both a receiver front-end stage 525, such as an AGC (or Automatic Gain Controller) and, a signal detector 526. The subsequent data signals with controlled gain from AGC are fed to a receiver complex 528 wherein more receiver components, such as a decision feed-back circuit, a clock recovery, are presented. When incoming signals having a predetermined amplitude and frequency are detected by the signal detector 526 of the invention, it generates an output signal SIG_DET that is sent to a logic block 529 to inform receiver system that "a good signal has been detected". In response to this, the receiver system will get ready to receive valid data. In this design, an up-channel driver 527 supplying a test pair of differential signals is prepared to send the test signal pair data from receiver side to a remote transmitter during setup, or test mode. In this example, a single-end test data are sent from the logic via the up-channel driver where the data is converted to a differential pair, they are then transmitted out through the same conductors for DN and DP. During test mode, the up-channel driver 527 can be used to test both local receiver and the signal detector.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A signal detector comprising:
   means for receiving a differential pair of input signals;
   means for generating a common mode (CM) level of said input signals;
   means for generating a predetermined threshold level referenced to a detected CM level;

means for generating a sensed signal level from said differential pair of input signals;

means for generating a reference level referenced to said threshold level;

means for eliminating gain variation between said sensed signal level as a result of receiving said differential pair of input signals, and said generated reference level; and, means for comparing said sensed signal level and said reference level to detect whether a valid input signal is being received, wherein said detector enables determination of a valid input signal within a predetermined signal margin.

2. The signal detector of claim 1, wherein said receiving means comprises a first peaking amplifier device for extending bandwidth of received input signals, said means for eliminating gain variation of said input signals and generated reference level comprising a second peaking amplifier device, identical to said first peaking amplifier device, for tracking gain variation between said sensed signal level and the reference level.

3. The signal detector of claim 1, further comprising a means for programmable generating a bias current utilized in generating said threshold level referenced to said CM level.

4. The signal detector of claim 3, wherein said means for programmable generating a bias current comprises a programmable current-based digital-to-analog converter device, said programmable current-based digital-to-analog converter device programmed to adjust a resistive voltage drop referenced to said CM level and comprising said threshold level.

5. The signal detector of claim 4, wherein said programmable current-based digital-to-analog converter device for programmably adjusting a bias current is adapted to reduce fluctuations of said generated threshold level and generated reference level, thus, contributing to said detection within said predetermined signal margin.

6. The signal detector of claim 4, wherein said threshold level comprises a first threshold level at a higher voltage than said common mode level, said reference level comprising a first reference level referenced to said first threshold level.

7. The signal detector of claim 6, wherein said threshold level comprises a second threshold level at a lower voltage than said common mode level, said detector comprising means for generating a second reference level from said second threshold level, wherein said comparing means further includes means for comparing said sensed signal level to said second reference level to determine if a valid input signal is present.

8. The signal detector of claim 4, wherein said programmable current-based digital-to-analog converter device for generating said bias current is adapted to modify said bias current to adjust the threshold signal for detecting signals in a specific receiver system.

9. The signal detection means of claim 8, wherein said programmable current-based digital-to-analog converter device for generating said bias current is adapted to modify said bias current to adjust the threshold signal for detecting signals in a receiver system having a specific voltage supply level.

10. The signal detector of claim 9, adapted for operating in a receiver systems having a voltage supply level ranging between 1.0 V to 1.95V.

11. The signal detector of claim 4, wherein said programmable current-based digital-to-analog converter device for generating said bias current obviates requirement of current mirror stage, thereby substantially minimizing current mapping errors.

12. The signal detection means of claim 1, wherein said means for generating a sensed signal level from said differential pair of input signals, comprises level detector means for averaging said sensed signal level.

13. The signal detection means of claim 12, wherein said level detector means further comprises means for averaging said reference level signal.

14. The signal detector of claim 1, adapted for detecting specific data patterns.

15. The signal detector of claim 1, wherein a latency of detecting a valid or invalid signal is less than 50 ns.

16. The signal detector of claim 1, adapted to operate at temperatures ranging between −40° C. to 125° C.

17. The signal detector of claim 1, adapted for detecting data in input signals of frequencies ranging between 100 MHz and 6 GHz.

18. The signal detector of claim 1, adapted for use in a communication apparatus that is set up in an AC coupling mode.

19. The signal detector of claim 1, adapted for use in a communication apparatus that is set up in DC coupling mode.

20. The signal detector of claim 1, adapted for determining a valid input signal within a predetermined signal margin ranging between 185 mV to 85 mV Vppd.

21. The signal detector of claim 1, adapted for determining a valid input signal within a predetermined signal margin ranging between 87.5 mV to 43.5 mV Vppd.

22. A method for detecting loss of signal on a pair of differential signal lines operable for receiving a differential pair of input signals, said method comprising:

a) receiving a differential pair of input signals;

b) generating a common mode (CM) level of said input signals;

c) generating a predetermined threshold level referenced to a detected CM level;

d) generating a sensed signal level from said differential pair of input signals;

e) generating a reference level referenced to said threshold level;

f) eliminating gain variation between said sensed signal level as a result of receiving said differential pair of input signals, and said generated reference level; and, g) comparing said sensed signal level and said reference level to detect whether a valid input signal is being received, wherein said detector enables determination of a valid input signal within a predetermined signal margin.

23. The method of claim 22, wherein said step of receiving said differential input signal pair comprises implementing a first peaking amplifier device for extending bandwidth of received input signals, said step of eliminating gain variation of said sensed input and generated reference level signals comprising implementing a second peaking amplifier device, identical to said first peaking amplifier device, for tracking gain variation of said reference level signal.

24. The method of claim 22, wherein said step of generating a threshold level comprises a step for programmable generating a bias current utilized in generating said threshold level referenced to said CM level.

25. The method of claim 24, wherein said step for programmable generating a bias current comprises programming a programmable current-based digital-to-analog converter device for adjusting a resistive voltage drop referenced to said CM level and comprising said threshold level.

26. The method of claim 25, wherein said programmable current-based digital-to-analog converter device for programmable generating a bias current is adapted to reduce fluctuations of said generated threshold level and generated reference level, thus, contributing to said detection within said predetermined signal margin.

27. The method of claim 25, wherein said step of generating said threshold level comprises generating a first threshold level at a higher voltage than said common mode level, said reference level comprising a first reference level referenced to said first threshold level.

28. The method of claim 27, wherein said step of generating said threshold level comprises generating a second threshold level at a lower voltage than said common mode level, said method further including a step for generating a second reference level from said second threshold level, wherein said comparing step further compares said sensed signal level to said second reference level to determine if a valid input signal is present.

29. The method of claim 22, wherein said step of generating a sensed signal level from said differential pair of input signals comprises a step of averaging said sensed signal level.

30. The method of claim 24, wherein said step of generating a reference level signal further comprises averaging said reference level signal.

31. The method of claim 25, wherein said step of programming said programmable current-based digital-to-analog converter device for generating said bias current includes modifying said bias current to adjust the threshold signal for detecting signals in a specific receiver system.

32. The method of claim 25, wherein said step of programming said programmable current-based digital-to-analog converter device for generating said bias current includes modifying said bias current to adjust the threshold signal for detecting signals in a receiver system having a specific power supply level.

33. The method of claim 22, including a step of determining a valid input signal within a predetermined signal margin ranging between 185 mV to 85 mV Vppd.

34. The method of claim 22, including a step of determining a valid input signal within a predetermined signal margin ranging between 87.5 mV to 43.5 mV Vppd.

35. A SerDes receiver system comprising a receiver element for receiving input signals, and a signal detector for detecting valid input signals from invalid input signals, said signal detector comprising:
   means for receiving a differential pair of input signals;
   means for generating a common mode (CM) level of said input signals;
   means for generating a predetermined threshold level referenced to a detected CM level;
   means for generating a sensed signal level from said differential pair of input signals;
   means for generating a reference level referenced to said threshold level;
   means for eliminating gain variation between said sensed signal level as a result of receiving said differential pair of input signals, and said generated reference level; and,
   means for comparing said sensed signal level and said reference level to detect whether a valid input signal is being received, wherein said detector enables determination of a valid input signal within a predetermined signal margin.

* * * * *